United States Patent [19]

Iino et al.

[11] Patent Number: 5,735,951
[45] Date of Patent: Apr. 7, 1998

[54] SINGLE CRYSTAL PULLING APPARATUS

[75] Inventors: Eiichi Iino; Kiyotaka Takano; Masanori Kimura; Koji Mizuishi; Hirotoshi Yamagishi, all of Gunma-ken, Japan

[73] Assignee: Shin-Etsu Handotai Co., Ltd., Tokyo, Japan

[21] Appl. No.: 673,590

[22] Filed: Jul. 1, 1996

[30] Foreign Application Priority Data

Jul. 4, 1995  [JP]  Japan .................................. 7-191087

[51] Int. Cl.⁶ .................................................. C30B 35/00
[52] U.S. Cl. ........................ 117/217; 117/208; 117/900
[58] Field of Search .................... 65/355, 347; 117/208, 117/217, 218, 222

[56] References Cited

U.S. PATENT DOCUMENTS

| | | |
|---|---|---|
| 4,350,560 | 9/1982 | Helgeland et al. |
| 5,254,319 | 10/1993 | Oda et al. .................. 117/218 |
| 5,330,729 | 7/1994 | Oda et al. .................. 117/218 |

FOREIGN PATENT DOCUMENTS

| | | |
|---|---|---|
| A-0 389 284 | 9/1990 | European Pat. Off. . |
| 000498652A1 | 8/1992 | European Pat. Off. .......... 117/218 |
| A-0 590 964 | 4/1994 | European Pat. Off. . |
| A-01 246191 | 12/1989 | Japan . |
| 404202084A | 7/1992 | Japan ............................... 117/218 |
| 404228492A | 8/1992 | Japan ............................... 117/218 |

*Primary Examiner*—Felisa Garrett
*Attorney, Agent, or Firm*—Ronald R. Snider

[57] ABSTRACT

A single crystal pulling apparatus which eliminates trouble caused by an isolation valve heated to a high temperature uses a heat insulation plate provided below the isolation valve. The heat insulation plate is operated synchronously with the opening or closing of the isolation valve. The heat insulation plate prevents hot gases from coming from the lower chamber from coming into direct contact with the isolation valve. The prevention of overheating of the isolation valve provides for smooth operation and growth of a good quality single crystal.

7 Claims, 6 Drawing Sheets

SINGLE CRYSTAL PULLING APPARATUS

The present disclosure relates to subject matter contained in Japanese patent application No. 191087 (filed on Jul. 4, 1995) which is expressly incorporated herein by reference in its entirety.

BACKGROUND OF THE INVENTION

1. Field of the Invention

The present invention relates to pulling apparatus for pulling a single crystal such as silicon based on a Czochralski method (which will be referred to as the CZ method, hereinafter) and more particularly, to a silicon single crystal pulling apparatus which can suitably prevent troubles caused by an isolation valve heated to a high temperature.

2. Description of the Related Art

As shown in FIG. 5, a pulling apparatus 1c for growing a single crystal according to the CZ method comprises a lower chamber 13 for accommodating a crucible 18 made of quartz and containing a silicon melt 17 therein, a heater 19 as a heating means and a heat insulator 20; an upper chamber 14 for accommodating a wire 23 by which a single crystal 22 starting with seed crystal 21 is pulled and a mechanism (not shown) for driving the wire; and a valve enclosure 15 for housing an isolation valve 16 which is disposed between the both chambers 13 and 14 to turn off communication between the both chambers 13 and 14. In this connection, the isolation valve 16, which has such a shape as to open or close an opening 24 defined between the lower and upper chambers 13 and 14, is made up of respective sealing means, a cooling means and a vacuum sustaining means.

In order to remove the fully-grown single crystal 22 from the pulling apparatus 1c, the opening 24 is first closed by the isolation valve 16 to keep inner pressure of the lower chamber 13 at its reduced pressure level, and then the single crystal 22 is taken out from the chamber after the inner pressure of the upper chamber 14 is returned to normal pressure.

Subsequently, the upper chamber 14 is subjected to a vacuum extraction, the isolation valve then the pulling operation of the single crystal 22 is again carried out.

When the isolation valve 16 is put in its closed state, the valve is received and carried at its tip end in a recess 6 provided in an wall of the upper chamber 14 as opposed to the valve enclosure 15.

As the single crystal 22 is increased in diameter, the isolation valve 16 has also been made large in size with its more complicated structure. Meanwhile, the interior of the pulling apparatus is kept in a high temperature atmosphere. When the isolation valve 16 comes into direct contact with the high temperature atmosphere of the pulling apparatus, this tends to cause such a trouble that the respective sealing means of the isolation valve 16 are susceptible to thermal failures or the cooling and vacuum sustaining means of the valve are damaged. Occurrence of such a problem causes the opening and closing operations of the isolation valve to become unreliable and the sealing properties thereof to be also deteriorated, with the result that the pulling operation of the single crystal 22 thereafter becomes impossible.

One of well-known prior arts associated with the above is directed to such a single crystal pulling apparatus as disclosed in Japanese Patent Laid-Open Publication No. 1-246191, wherein a closing cylinder for closing the inlet and outlet ports of an isolation valve is provided at a lower end of interior of an upper chamber to be moved up and down along the inner peripheral surface of the upper chamber. In this known prior art, when the isolation valve is put in its open state, the valve can be prevented from being exposed to a high temperature atmosphere of the pulling apparatus. When the isolation valve is put in its closed state, however, the valve comes into direct contact with the high temperature atmosphere, which means that the above problem in the prior art is not solved yet sufficiently. Further, the closing cylinder is moved up and down along the inner peripheral surface of the upper chamber as mentioned above. This disadvantageously results in that the up/down movement mechanism becomes complicated, and particles or foreign matters generated from an SiO film formed on the inner peripheral surface of the upper chamber may fall into a crucible together with the up and down movement of the closing cylinder. This disadvantageously leads to the fact that a resultant crystal becomes an inferior crystal having dislocations, with its decreased productivity and increased costs.

SUMMARY OF THE INVENTION

In view of the above circumstances, it is accordingly an object of the present invention to provide a single crystal pulling apparatus which can prevent an isolation valve is prevented from being heated to a high temperature, thereby realizing smooth pulling operation of a single crystal, easy disposition thereof within the apparatus due to its simple structure, and also prevention of falling of particles into a crucible.

In accordance with an aspect of the present invention, there is provided a single crystal pulling apparatus which comprises a lower chamber for housing a crucible for containing a melt and means for heating the melt, an upper chamber for housing a wire by which a single crystal is pulled from the crucible starting with a seed crystal and a mechanism for driving the wire, and a valve enclosure for accommodating an isolation valve which acts to open or close an opening defined between the both upper and lower chambers, wherein a heat insulation plate is provided below the isolation valve to open or close the opening synchronized with opening or closing operation of the isolation valve.

In a first variation of the single crystal pulling apparatus of the present invention, the heat insulation plate performs its closing operation simultaneously with the closing operation of the isolation valve or somewhat faster, whereas the heat insulation plate performs its opening operation simultaneously with the opening operation of the isolation valve or somewhat later.

In a second variation of the single crystal pulling apparatus of the present invention, further, the heat insulation plate is disposed within the valve enclosure and thereunder.

In a third variation of the single crystal pulling apparatus of the present invention, furthermore, the heat insulation plate is disposed within a heat insulation plate enclosure as separated from the valve enclosure.

In a fourth variation of the single crystal pulling apparatus of the present invention, in addition, the heat insulation plate is made in the form of a shutter for covering or uncovering the opening to close or open the opening.

In accordance with the single crystal pulling apparatus of the aspect of the present invention, since the height insulation plate provided below the isolation valve opens or closes the opening synchronized with opening or closing operation of the isolation valve, heat coming from the lower chamber is interrupted by the heat insulation plate to thereby block the heat transmission to the isolation valve. Thus, the isolation valve can be prevented from being heated to a high temperature.

In accordance with the single crystal pulling apparatus of the first variation of the present invention, since the heat insulation plate performs its closing operation simultaneously with the closing operation of the isolation valve or somewhat faster, the thermal influences on the isolation valve can be suppressed. When it is desired to open the isolation valve, further, since the heat insulation plate performs its opening operation simultaneously with the opening operation of the isolation valve or somewhat later, then thermal influences on the isolation valve can also be suppressed.

In accordance with the single crystal pulling apparatus of the second variation of the present invention, the accommodation space of the heat insulation plate can be simplified and thus the heat insulation plate can be relatively easily mounted in the equipment.

In accordance with the single crystal pulling apparatus of the third variation of the present invention, since the heat insulation plate is accommodated as separated from the valve enclosure, the adverse effects on the isolation valve caused by the opening or closing operation of the heat insulation plate can be prevented. Further, the mechanism for opening or closing the heat insulation plate can also be relatively easily mounted.

In accordance with the single crystal pulling apparatus of the fourth variation of the present invention, since the heat insulation plate in the form of a non-reciprocating shutter is employed for covering or uncovering the opening to close or open the opening, the heat insulation plate can be simplified in its installation space and can perform its opening or closing operation or stroke at a high speed.

DESCRIPTION OF THE PREFERRED EMBODIMENTS

Figure 1:
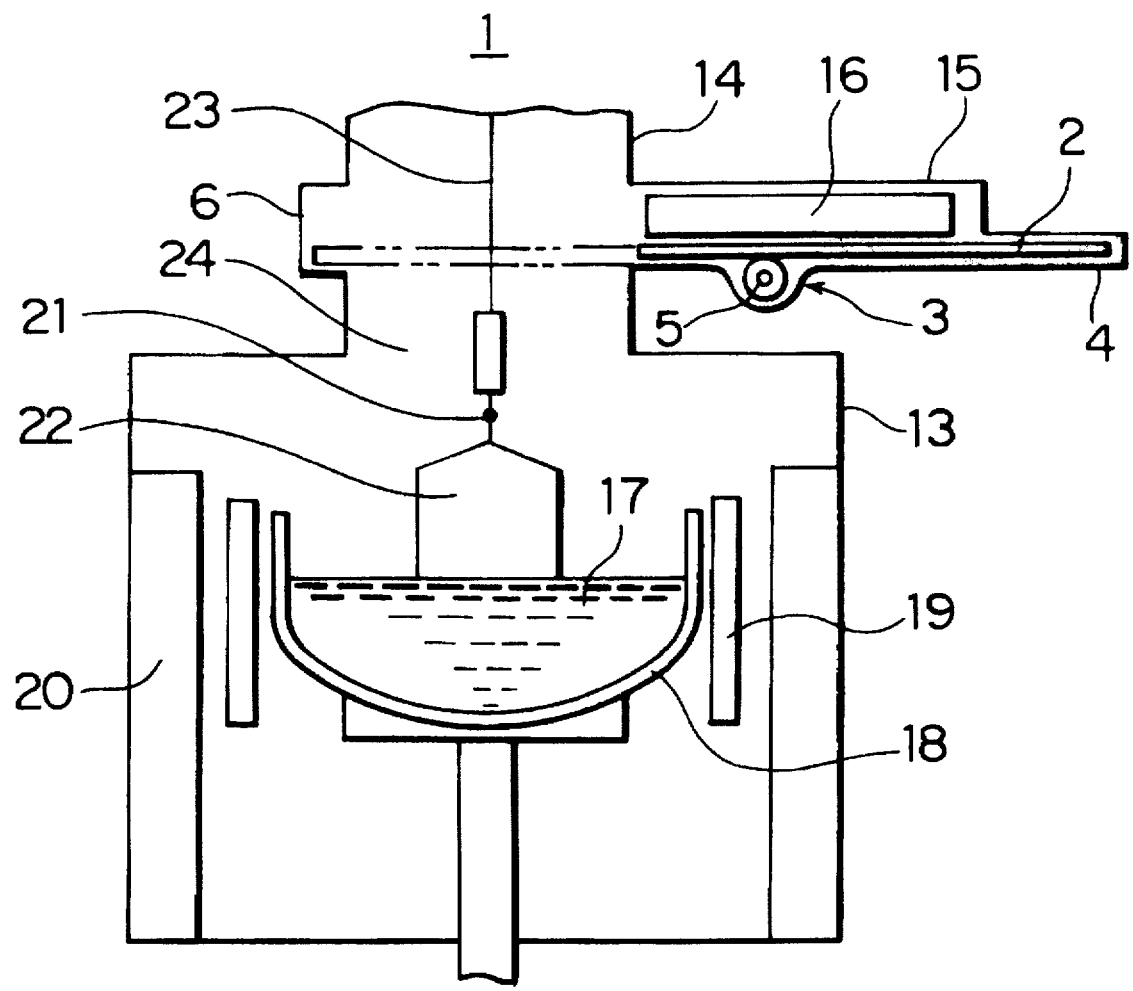
FIG. 1 is an axial cross-sectional view of an entire structure of a pulling apparatus in accordance with an embodiment of the present invention.
Figure 2:
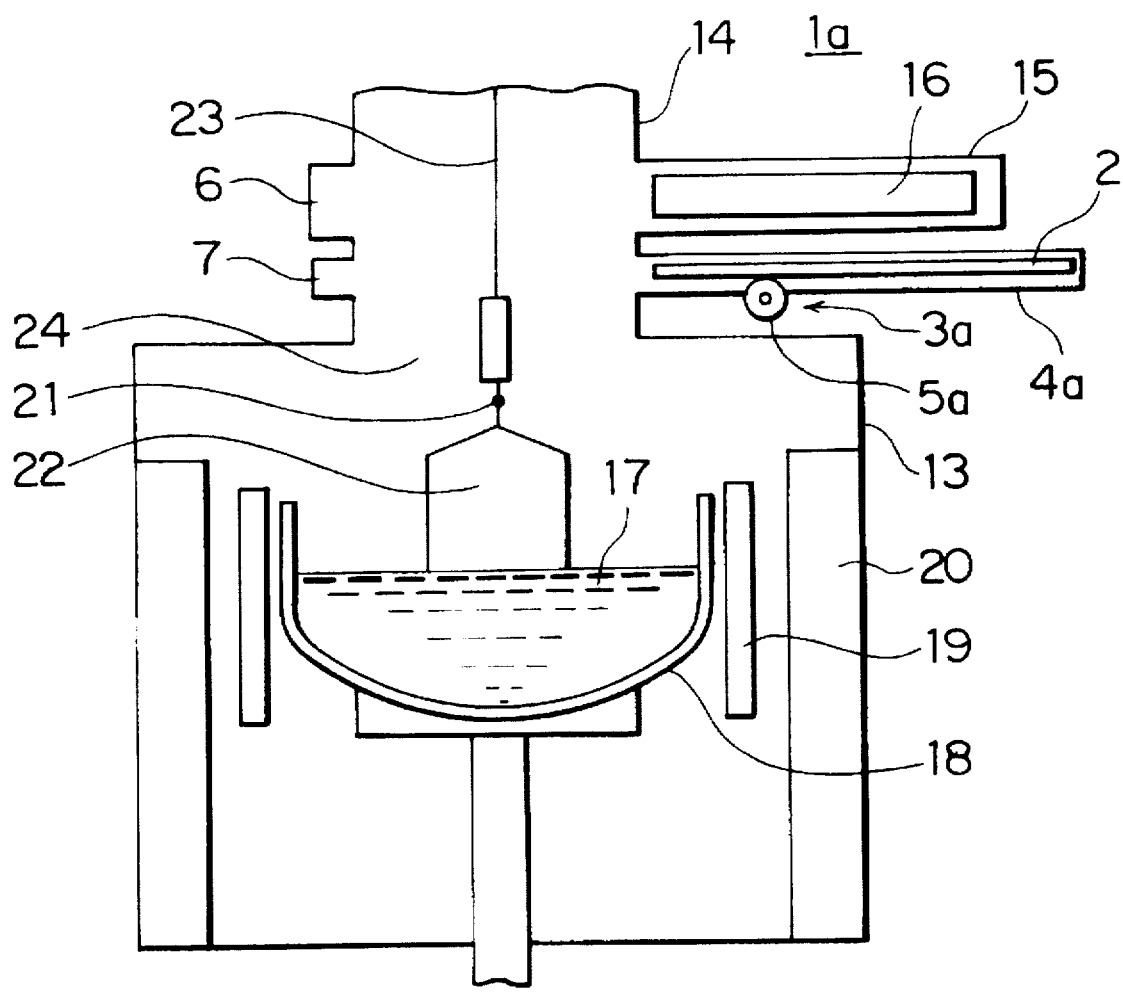
FIG. 2 is an axial cross-sectional view of an entire structure of a pulling apparatus in accordance with another embodiment off the present invention having an isolation valve enclosure and a heat insulation plate enclosure provided as separated therefrom.
Figure 3:
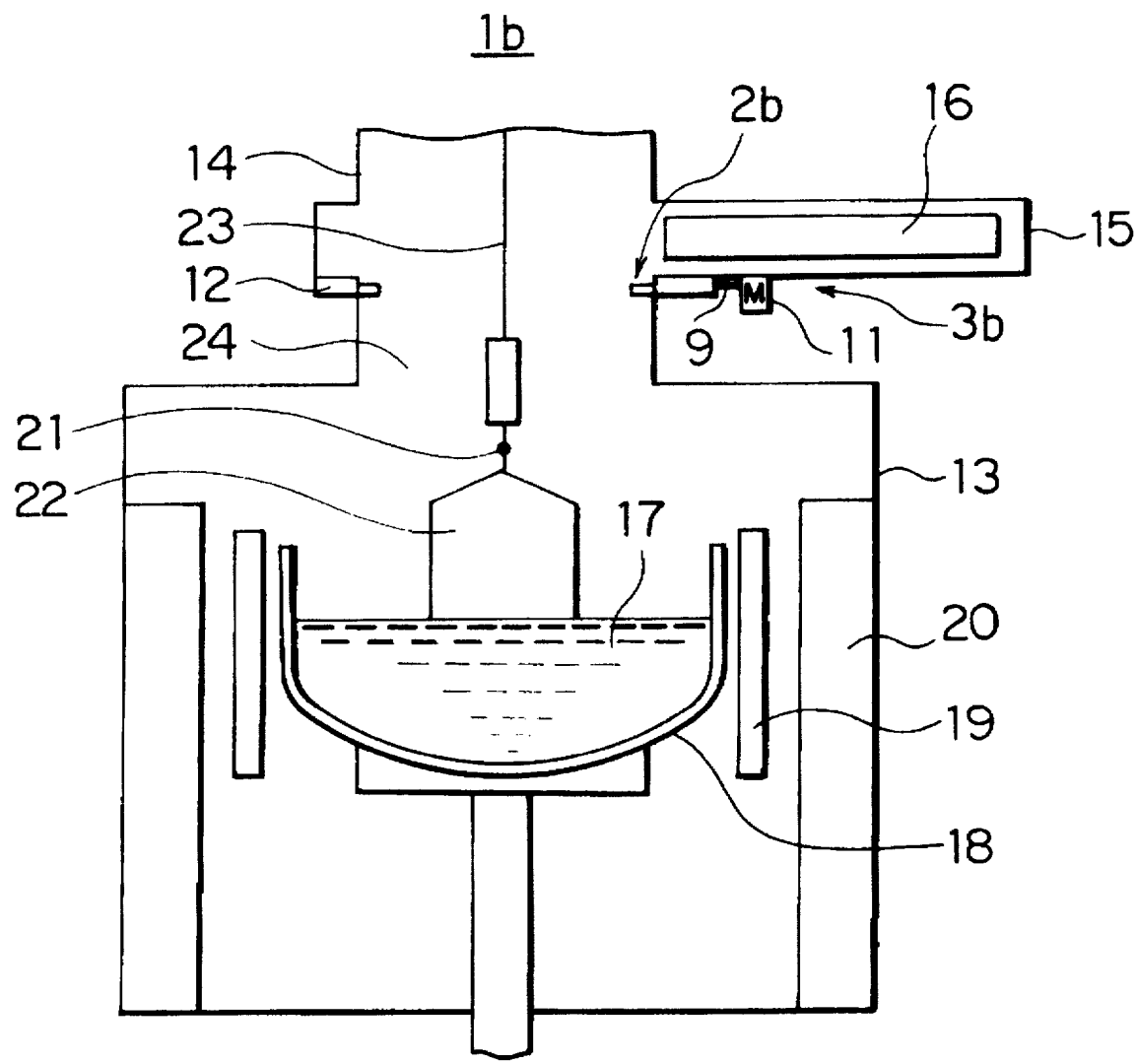
FIG. 3 is an axial cross-sectional view of an entire structure of a pulling apparatus in accordance with a further embodiment of the present invention having a heat insulation plate of a shutter-like structure.
Figure 4B:
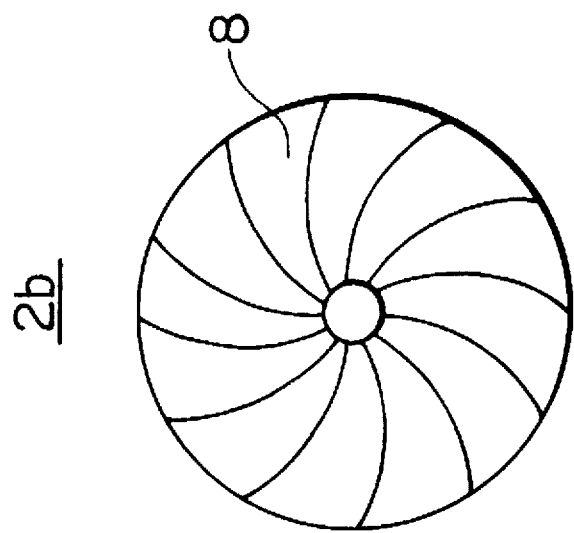
FIG. 4 shows plan views of a detailed structure of the heat insulation plate in FIG. 3 and of a schematic structure of an opening/closing means therefor.
Figure 4A:
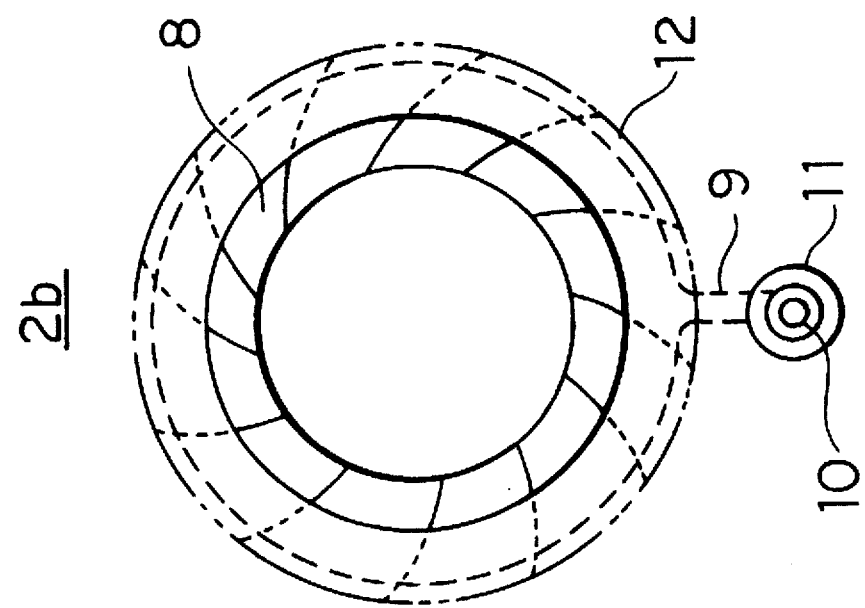
Figure 5:
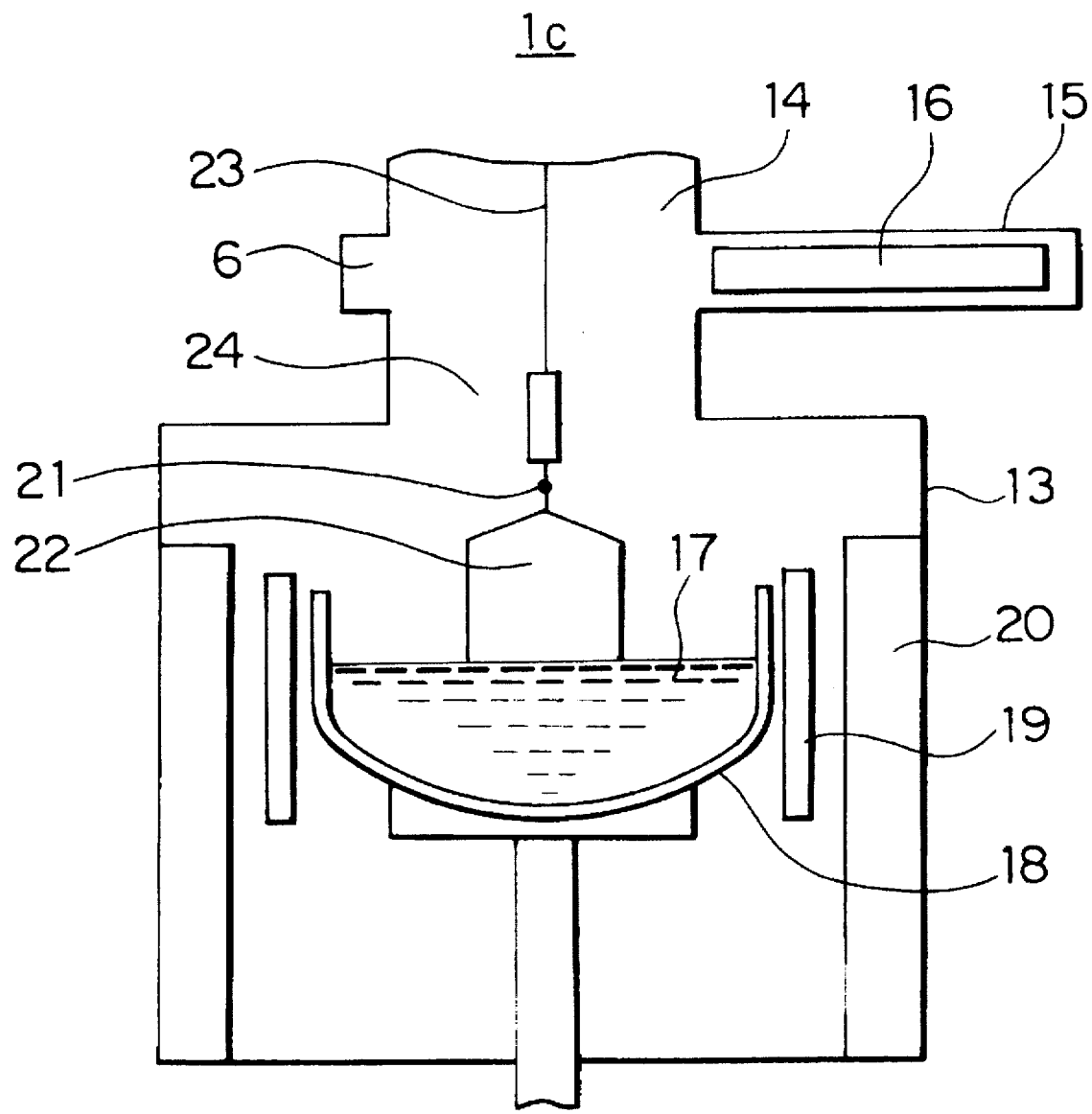
FIG. 5 (prior art) an axial cross-sectional view of an entire structure of a prior art pulling apparatus.

Embodiments of the present invention will be detailed with reference to the attached drawings. FIG. 1 is an axial cross-sectional view of a pulling apparatus in accordance with an embodiment of the present invention having an isolation valve and a heat insulation plate provided below the isolation valve, FIG. 2 is an axial cross-sectional view of a pulling apparatus in accordance with another embodiment of the present invention having a valve enclosure and a heat insulation plate enclosure provided as separated therefrom, FIG. 3 is an axial cross-sectional view of a pulling apparatus in accordance with a further embodiment of the present invention having a heat insulation plate of a shutter-like structure, and FIG. 4 shows plan views for explaining the opening and closing operations of the heat insulation plate in FIG. 3.

As shown in FIG. 1, a single crystal pulling apparatus 1 comprises a lower chamber 13, an upper chamber 14, and a valve enclosure 15 disposed between the chambers 13 and 14. As has been already explained earlier, the lower chamber 13 houses a crucible 18 for containing a silicon melt 17, a heater 19 and a heat insulator 20; while the upper chamber 14 houses a wire 23 by which a single crystal 22 is growingly pulled starting with a seed crystal 21 and also houses a mechanism (not shown) for driving the wire and associated parts. Housed in the valve enclosure 15 is an isolation valve 16.

Also in FIG. 1, a heat insulation plate 2 is disposed below the isolation valve 16 accommodated in the valve enclosure 15 in a parallel positional relation thereto. The heat insulation plate 2 is accommodated in an enclosure 4 slightly projected from the valve enclosure 15 for stroke purpose. The heat insulation plate 2 is provided with an opening/closing means 3 for reciprocating the heat insulation plate 2 to open or close the valve. In the present embodiment, the heat insulation plate 2 is formed at its one side with a rack (not shown) which is meshed with a pinion gear 5 driven by a motor (not shown). Although the above rack, pinion gear 5 and motor form the aforementioned opening/closing means in the present embodiment, the present invention is not limited to the specific example. When the motor is driven to rotate the pinion gear 5, the heat insulation plate 2 is moved to thereby open or close an opening 24 defined between the upper and lower chambers 14 and 13. When the opening 24 is put in its closed state, the heat insulation plate 2 is housed as carried together with the isolation valve 16 in the recess 6, and also housed as carried at its tip end in the heat insulation plate enclosure 4.

The motor and the mechanism for driving the isolation valve 16 are controlled synchronized with each other by a control means (not shown). More in detail, when it is desired to close the opening 24, the motor is first operated to move the heat insulation plate 2 in its closing direction. At the same time or slightly later, the drive mechanism of the isolation valve 16 is actuated to move the isolation valve 16 in its closing direction. When it is desired to open the opening 24, on the other hand, the isolation valve 16 is first moved in its opening direction. At the same time or slightly later, the motor of the heat insulation plate 2 is driven to move the heat insulation plate 2 in the opening direction synchronized with the drive mechanism of the isolation valve 16. With such an arrangement as mentioned above, hot gas coming at least from the lower chamber 13 can be prevented from coming into direct contact with the isolation valve 16.

For the heat insulation plate 2, for example, a plate obtained by impregnating heat-resistant inorganic fiber material with material having an ability of changing to carbide material, molding and then sintering it at a high temperature may be used. In this connection, the above heat-resistant inorganic fiber material may be made of, e.g., silicon carbide (SIC), silicon nitride ($Si_3N_4$), molybdenum (Mo), tungsten (W), tantalum (Ta) or quartz, or may be carbon fibers or carbon fibers coated with glass.

Figure 6:
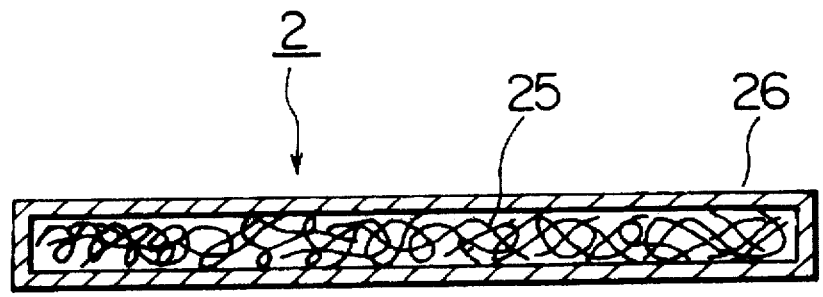
FIG. 6 is a cross-sectional view of an example of the heat insulation plate.

Further, the heat insulation plate may comprise a molded plate 25 made of the aforementioned heat-resistant inorganic fiber material coated on its outer surface with a ceramic layer 26, as shown in FIG. 6.

Figure 7:
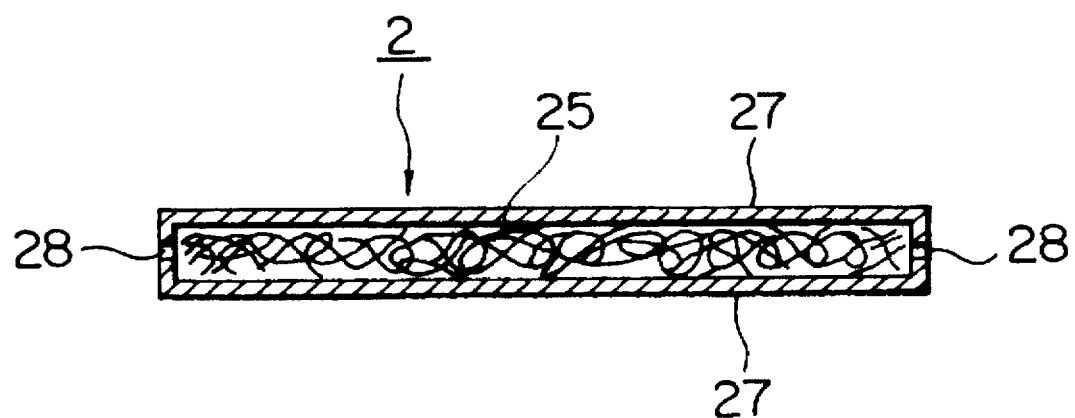
FIG. 7 is a cross-sectional view of another example of the heat insulation plate.

When the ceramic layer is replaced by a metallic layer, it is preferable that a metallic layer 27 be provided at least on upper and lower sides of the molded plate 25 and a ring-shaped heat insulating cover 28 be provided around the periphery of the heat insulating cover 28 for heat isolation, as shown in FIG. 7.

Turning now to FIG. 2, there is shown a single crystal pulling apparatus 1a which is substantially the same in structure as that of FIG. 1 but different therefrom in that an enclosure 4a for accommodating the heat insulation plate 2 is formed as separated from the valve enclosure 15. In other words, the heat insulation plate enclosure 4a is formed in the side wall of the upper chamber 14 as positioned below the valve enclosure 15 in a substantially parallel positional relation to the valve enclosure 15. Since the heat insulation plate enclosure 4a is provided as separated from the valve enclosure 15 undesirable interference between various means housed within the valve enclosure 15 and the heat insulation plate 2 per se and opening/closing means 3 therefor can be avoided, and additionally layout of the opening/closing means 3 can be implemented with a high flexibility.

Furthermore, the above separated provision enables suppression of heat transmission from the heat insulation plate 2 to the isolation valve 16, thus softening or reducing the detrimental thermal influences. Also the isolation valve 16 can be prevented from being adversely influenced by particles or foreign matters introduced from the heat insulation plate 2. In the present embodiment, as in the foregoing embodiment, opening/closing means 3a includes a pinion gear 5a and a motor (not shown) such that the engagement of the pinion gear 5a with the aforementioned rack of the heat insulation plate 2 causes opening or closing operation of the heat insulation plate 2. When the isolation valve 16 is put in the closed state, the heat insulation plate 2 is received and carried at its tip end in an enclosure 7 disposed opposite to the heat insulation plate enclosure 4a.

In FIG. 2, parts having the same functions as those in FIG. 1 are denoted by the same reference numerals or symbols.

Shown in FIG. 3 is a single crystal pulling apparatus 1b which comprises a heat insulation plate 2b of a shutter-shaped structure. The arrangement other than the heat insulation plate 2b and an opening/closing means 3b therefor is the same as that of the foregoing embodiments, and therefore explanation thereof is omitted. As illustrated, the heat insulation plate 2b, which is disposed to cover directly the opening 24, functions to open or close the opening 24 synchronized with the isolation valve 16. The heat insulation plate 2b has such a structure as a shutter used in a photographic camera or the like, that is, a multiplicity of shutter blades 8 are arranged as radially extended and partially overlapped with each other, as shown in FIG. 4, (a) and (b). The opening/closing means 3b, which structure is well known, is made up, as an example, of a wire member 9 engaged with the respective shutter blades 8, a wind-up pulley 10 and a motor 11. Forward or reverse rotation of the motor 11 causes opening or closing of the shutter blades 8 as shown in FIG. 4. When the shutter blades 8 are put in their opened state, the shutter blades 8 are received in a shutter enclosure 12.

Although such heat insulation plates 2, 2b and opening/closing means 3, 3a as illustrated have been employed in the foregoing embodiments, it goes without saying that the present invention is not restricted to the specific examples. For example, the heat insulation plate or opening/closing means may have a structure of a rotary type or a double-leafed hinged door type, so long as the heat insulation plate has such a structure as not to come into direct contact with the hot gas introduced from the lower chamber 13 when the isolation valve 16 is put in the closed state, in either case.

The present invention can exhibit remarkable effects which follow.

1) In accordance with the single crystal pulling apparatus of the embodiment of the present invention, since the heat insulation plate provided below the isolation valve opens or closes the opening synchronized with opening or closing operation of the isolation valve, the isolation valve can be prevented from coming into direct contact with hot gas coming from the lower chamber. For this reason, the isolation valve can be prevented from being heated to a high temperature, thus also solving troubles such as damage of the sealing means, water leakage of cooling means and damage of the vacuum sustaining means, all involved by the high temperature. Such a danger as water evaporation explosion can also be avoided.

2) In accordance with the single crystal pulling apparatus of the first variation of the embodiment of the present invention, since at least the heat insulation plate is moved in its closing direction faster than the isolation valve and is moved in its opening direction later therethan, direct contact of the isolation valve with the SiO gas can be reliably avoided.

3) In accordance with the single crystal pulling apparatus of the second variation of the embodiment of the present invention, the array of the heat insulation plate can be compactly realized, thus saving its mounting space.

4) In accordance with the single crystal pulling apparatus of the third variation of the embodiment of the present invention, since the enclosure of the heat insulation plate is provided as separated from the valve enclosure, the adverse thermal effects on the isolation valve can be prevented by the heat insulation plate, the attachment of particles or foreign matters onto the isolation valve can be prevented, the disposition of the opening/closing means of the heat insulation plate can be implemented with a high flexibility, and the interference with the isolation valve can be avoided.

5) In accordance with the single crystal pulling apparatus of the fourth variation of the embodiment of the present invention, since the heat insulation plate in the form of a shutter is employed, the heat insulation plate can perform its opening or closing operation or stroke rapidly and its mounting space can be saved.

What is claimed is:

1. A single crystal pulling apparatus comprising:
   a lower chamber for housing a crucible for containing a melt and means for heating said melt;
   an upper chamber for housing a wire by which a single crystal is pulled from said crucible starting with a seed crystal and a mechanism for driving said wire; and
   a valve enclosure for accommodating an isolation valve which acts to open or close an opening defined between said both upper and lower chambers,
   a heat insulation plate provided below said isolation valve for opening or closing said opening, and for blocking heat transmission to the isolation valve, and wherein opening and closing of said heat insulation plate is synchronized with opening or closing of said isolation valve.

2. A single crystal pulling apparatus as set forth in claim 1, wherein said heat insulation plate performs its closing operation simultaneously with or in advance of the closing operation of the isolation valve; and the heat insulation plate performs its opening simultaneously with or following the opening operation of the insulation valve.

3. A single crystal pulling apparatus as set forth in claim 1, wherein said heat insulation plate is disposed within said valve enclosure and thereunder.

4. A single crystal pulling apparatus as set forth in claim 3, wherein said heat insulation plate is disposed within a heat insulation plate enclosure as separated from said valve enclosure.

5. A single crystal pulling apparatus as set forth in claim 1, wherein said heat insulation plate is made in the form of a shutter for covering or uncovering said opening to close or open the opening.

6. A single crystal pulling apparatus as set forth in claim 1, wherein said heat insulation plate performs its closing operation in advance of or before the closing operation of said isolation valve.

7. A single crystal pulling apparatus as set forth in claim 1, wherein said heat insulation plate performs its opening operation simultaneously with or after the opening operation of said isolation valve.

* * * * *